United States Patent [19]
Kobayashi

[11] Patent Number: 5,550,520
[45] Date of Patent: Aug. 27, 1996

[54] MONOLITHIC HBT ACTIVE TUNEABLE BAND-PASS FILTER

[75] Inventor: Kevin W. Kobayashi, Torrance, Calif.

[73] Assignee: TRW Inc., Redondo Beach, Calif.

[21] Appl. No.: 420,262

[22] Filed: Apr. 11, 1995

[51] Int. Cl.$^6$ .......................... H03H 11/04; H03H 11/52
[52] U.S. Cl. .......................... 333/213; 327/553; 327/557; 333/217
[58] Field of Search ........................... 333/213, 217; 327/553, 557

[56] References Cited

U.S. PATENT DOCUMENTS

| | | |
|---|---|---|
| 3,221,181 | 11/1965 | Kiyasu et al. . |
| 3,458,715 | 7/1969 | Hartman . |
| 3,594,593 | 7/1971 | Ho et al. . |
| 3,594,650 | 7/1971 | Henoch . |
| 3,693,105 | 9/1972 | Kleinberg . |
| 3,737,801 | 6/1973 | Adams et al. . |
| 3,835,399 | 9/1974 | Holmes . |
| 3,965,441 | 6/1976 | Roy et al. . |
| 3,974,399 | 8/1976 | Oyama et al. . |
| 4,028,562 | 6/1977 | Zaleeg .................. 333/217 X |
| 4,257,055 | 3/1981 | Hess et al. . |
| 4,409,557 | 10/1983 | Sechi ...................... 330/277 |
| 4,430,630 | 2/1984 | Sakamoto ................. 334/15 |
| 4,740,716 | 4/1988 | Silverman . |
| 4,816,788 | 3/1989 | Ishikawa et al. ............. 333/217 X |
| 4,839,612 | 6/1989 | Akagi ....................... 330/302 |
| 4,990,872 | 2/1991 | Ishiguro et al. ............. 333/213 |
| 5,339,057 | 8/1994 | Rauscher .................... 333/166 |

OTHER PUBLICATIONS

V. Aparin and P. Katzin, Applied Microwave & Wireless Fall 1994, "Electrically Tuned L–S Band Filters", pp. 42, 44–46, 48–49.

Primary Examiner—Paul Gensler

[57] ABSTRACT

An active tuneable band-pass filter is provided which has a negative resistance circuit for generating a tuneable amount of negative resistance for a passive band-pass filter structure so as to compensate for resistive losses. The negative resistance circuit has a bipolar transistor with a base connected in shunt to the passive filter structure and a collector connected to a shunt inductive element. A negative resistance is generated at the base of the transistor and is applied to the passive filter structure. A coarse Q-factor tuning circuit is coupled to the emitter of the transistor for providing a coarse amount of tuning of the negative resistance. Also connected to the emitter terminal, is a fine tuning circuit for providing fine tuning of the negative resistance. The fine tuning may be achieved manually or automatically with a control circuit. The coarse and fine tuning capability provides a tuneable negative resistance which eliminates oscillations and compensates for resistive loss variations to realize improved q-factor.

17 Claims, 7 Drawing Sheets

MONOLITHIC HBT ACTIVE TUNEABLE BAND-PASS FILTER

BACKGROUND OF THE INVENTION

1. Technical Field

The present invention relates generally to band-pass filters and, more particularly, to a monolithically integrated active band-pass filter with a tuneable negative resistance circuit to compensate for resistive losses.

2. Discussion

Narrow band-pass filters which realize low insertion-loss and good shape factors (Q-factor) are required for many commercial applications. With the rapid technological advancements being made in the communications industry, it is important to provide for small, low power, high frequency circuit components for use in wireless hand held portable communications systems. Such applications encompass transmitters and receivers for use with global positioning systems (GPS), direct broadcast systems (DBS), cellular phone systems, local area networks (LAN), wireless internet applications and various other applications. In order to reduce the physical size and power consumption of circuit components, it is often desirable to integrate the filter components onto a single semiconductor chip, when possible. However, reduced size of the integrated circuits often results in a reduced Q-factor which in turn degrades the signal-to-noise ratio and results in poor frequency selectivity of the filter.

The passive circuit components which generally make up a band-pass filter structure are commonly fabricated on a semi-insulating substrate such as a gallium arsenide (GaAs) substrate or an indium phosphide (InP) substrate. Band-pass filter circuit components typically include spiral inductors, capacitors and resistors, which are generally printed, etched, or otherwise fabricated on the semi-insulating substrate. Since semi-insulating materials are not perfect insulators, the quality factor of spiral inductors, capacitors and other passive circuit components formed thereon is limited. Furthermore, resistive losses are commonly present and such losses adversely effect the performance of the filter. In addition, the metal interconnects used in many GaAs and InP semiconductor devices have finite resistances, which further adds to the overall resistive losses. Uncompensated resistive losses tend to degrade the overall quality factor of the filter and add to the overall insertion losses that remain present.

In order to compensate for these resistive losses, a number of approaches have considered the use of an active element to generate a negative resistance feedback signal that is applied to the passive filter structure. In the past, conventional approaches have employed a fixed negative resistance circuit for producing a negative resistance that is applied to the passive filter structure to compensate for resistive losses. For example, in some conventional approaches, a fixed amount of negative resistance is provided, despite the possibility of subsequent changes in the overall resistive losses. Changes in resistive losses may occur, especially due to temperature changes and aging of the filter. Accordingly, many conventional filters offer a very limited tuning capability, if any.

It is therefore desirable to provide for an improved active band-pass filter which provides a negative resistance signal to a passive band-pass filter structure to compensate for resistive losses.

It is further desirable to provide for such a band-pass filter which can be accurately adjusted to cancel out resistive losses and achieve good quality factors and near zero insertion loss.

Yet, it is also desirable to provide for an active band-pass filter with a negative resistance circuit that allows for enhanced Q-factor tunability and offers subsequent tuning capability.

It is also desirable to provide for an active tunable band-pass filter which monolithically integrates circuit components onto a single chip to allow for minimum size requirements and realizes low power consumption.

SUMMARY OF THE INVENTION

In accordance with the teachings of the present invention, an active band-pass filter is preferably formed on a semi-insulating substrate. The active band-pass filter includes a tuneable negative resistance circuit connected in shunt to a passive band-pass filter structure for producing a tuned negative resistance to compensate for resistive losses associated with the filter structure. The negative resistance circuit has a three terminal device, which is preferably a bipolar transistor with a base terminal connected in shunt to the passive band-pass filter structure. Coupled to a collector terminal of the transistor is a shunt inductive element. The negative resistance circuit also includes a coarse tuning circuit and a fine tuning circuit coupled to an emitter terminal of the transistor. The coarse tuning circuit provides coarse Q-factor tuning, while the fine tuning circuits allow for fine Q-factor tuning of the negative resistance.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENTS

Figure 1:
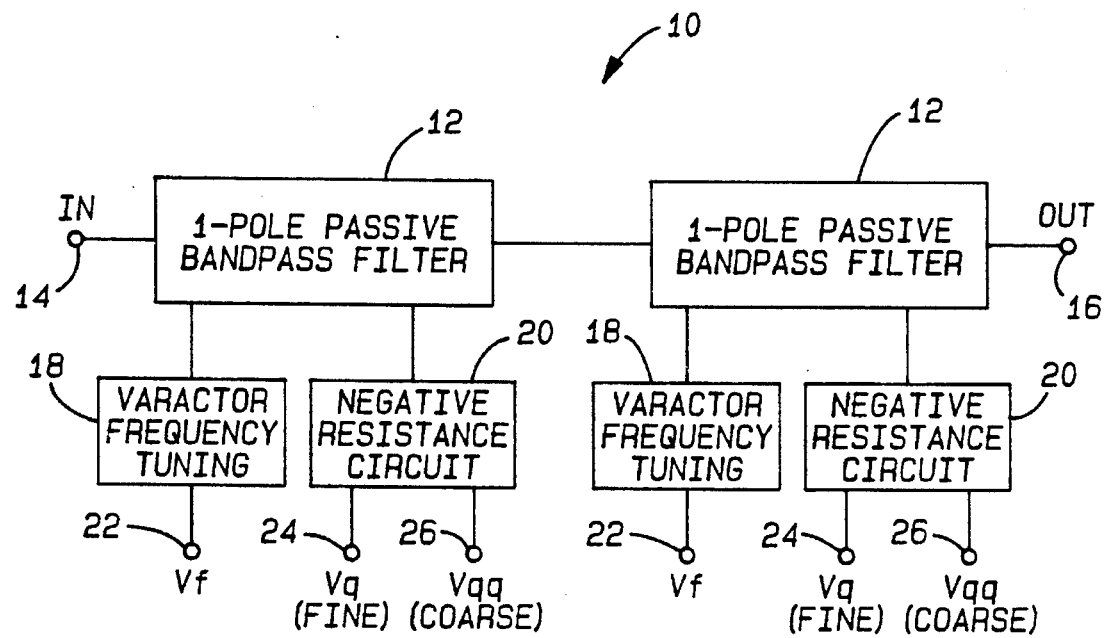
FIG. 1 is a block diagram illustrating the general lay-out of an active two-pole monolithic band-pass filter according to one embodiment of the present invention.

Turning now to FIG. 1, an active tuneable band-pass filter 10 is shown in a two-section filter configuration according to one embodiment of the present invention. More particularly, the active band-pass filter 10 is shown having a pair of one-pole passive band-pass filter structures 12 connected in series between an input 14 and an output 16. Each passive band-pass filter structure 12 is connected to a varactor frequency tuning circuit 18 which in turn receives a frequency tuning voltage $V_f$ via input 22. In addition, each passive band-pass filter structure 12 is also connected to a corresponding negative resistance circuit 20. Each negative resistance circuit 20 receives Q-factor input voltages $V_q$ and $V_{qq}$ via respective inputs 24 and 26. Together, each combination of a passive band-pass filter structure 12 with a varactor frequency tuning circuit 18 and a negative resistance circuit 20 makes up one section of the active band-pass filter 10.

While one preferred embodiment of the present invention as shown in FIG. 1 has a pair of passive band-pass filter structures 12, the teachings of the present invention are applicable to various single or multi-pole or multi-section passive band-pass filter structures. For multi-pole or multi-section applications, it is generally preferred that each passive band-pass filter structure 12 be connected to its own corresponding varactor frequency circuit 18 and negative resistance circuit 20. A detailed description of the active band-pass filter 10 of the present invention will now be described in connection with a single-pole single-section passive band-pass filter structure 12 as presented in FIGS. 2 and 3.

Figure 2:
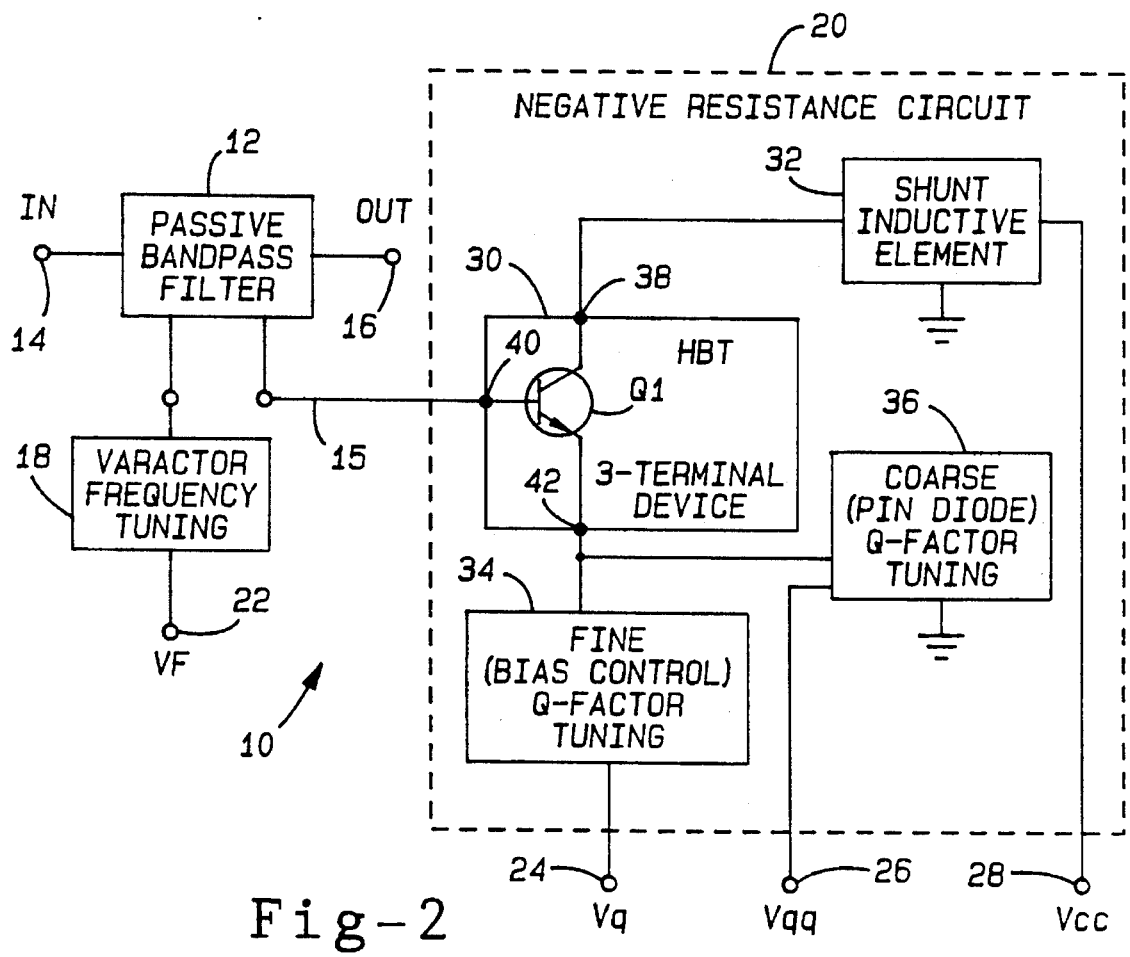
FIG. 2 is a block diagram illustrating the general lay-out of an active one-pole monolithic band-pass filter according to a second embodiment of the present invention.
Figure 3:
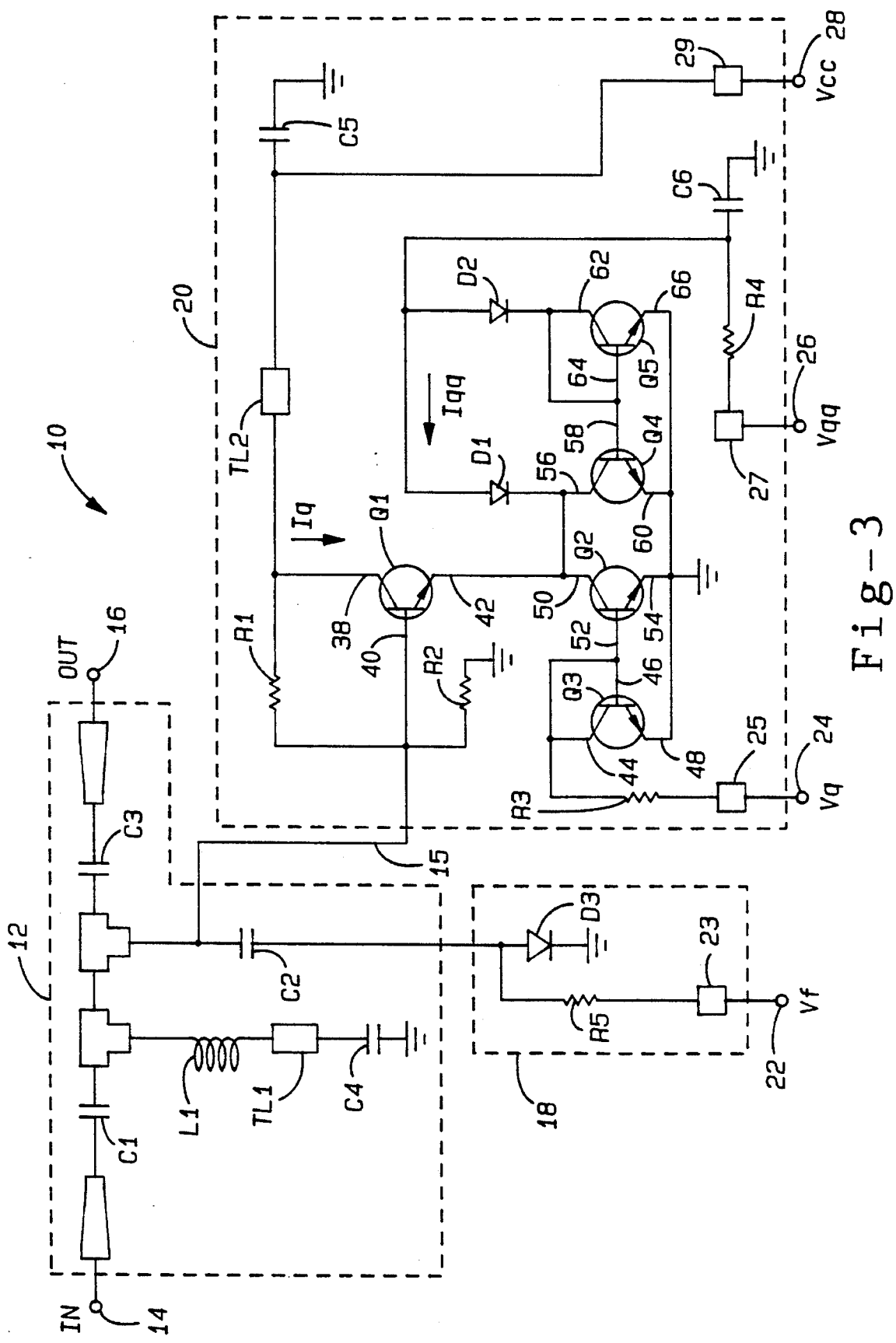
FIG. 3 is a circuit diagram illustrating the monolithic one-pole active band-pass filter and details a tuneable negative resistance circuit according to the present invention.

Referring to FIGS. 2 and 3, the active band-pass filter 10 is shown with a single-pole passive band-pass filter structure 12 according to the single-section embodiment of the present invention. Generally speaking, the passive band-pass filter structure 12 is an LC circuit generally made up of a plurality of inductive and capacitive circuit components fabricated on a gallium arsenide (GaAs) substrate. In particular, passive band-pass filter structure 12 includes capacitors C1, C2, C3 and C4, spiral inductor L1 and a transmission line TL1. Transmission line TL1 is a microstrip configured line which provides an inductance. The passive band-pass filter structure 12 may include a wide variety of known filter configurations. However, the present invention is particularly suited for employing passive filters formed on top of semiconductor semi-insulating substrates which generally exhibit some resistive losses.

The varactor frequency tuning circuit 18 is composed of a PIN diode D3 and a resistor R5. The anode terminal of diode D3 is connected to capacitor C2 of filter structure 12, while the cathode terminal is coupled to ground. The anode terminal of PIN diode D3 is also coupled to resistor R5 which in turn is connected to an input pad 23. Input pad 23 receives a frequency tuning voltage $V_f$ via input 22. The varactor frequency tuning circuit 18 tunes the center frequency $f_o$ of the band-pass filter structure 12. This is generally accomplished by controlling the frequency tuning voltage $V_f$ as should be evident to those skilled in the art.

The negative resistance circuit 20, as presented in FIG. 2, is generally made up of a three terminal device 30 such as a heterojunction bipolar transistor (HBT) Q1, a shunt inductive element 32, fine Q-factor tuning circuitry 34 and coarse Q-factor tuning circuitry 36. The fine Q-factor tuning circuit 34 receives a fine tuning input voltage $V_q$ via input 24 for achieving a fine tuning resolution of negative resistance adjustments. Fine tuning voltage $V_q$ may vary in response to a manual selection or an automatically controlled variance.

With particular reference to FIG. 3, the negative resistance circuit 20 is illustrated in further detail therein. The three-terminal device 30 of negative resistance circuit 20 is preferably a heterojunction bipolar transistor (HBT) Q1 which includes a base terminal 40, a collector terminal 38 and an emitter terminal 42. While an HBT Q1 is shown, other three terminal solid state devices such as a field effect transistor FET could be used in place thereof. The base terminal 40 of transistor Q1 is connected in shunt to the passive band-pass filter structure 12 for providing negative resistance to filter structure 12 via connecting line 15. A feedback resistor R1 is connected between the collector terminal 38 and base terminal 40 of transistor Q1. A bias resistor R2 is connected between the base terminal 40 of transistor Q1 and ground. Bias resistor R2 essentially completes a parallel feedback path and provides a DC bias to the base 40 of transistor Q1.

The collector terminal 38 of bipolar transistor Q1 is further coupled to the shunt inductive element 32. The shunt inductive element 32 receives an input bias voltage $V_{cc}$ via input 28. According to one embodiment, shunt inductive element 32 includes a microstrip transmission line TL2 which has one end shorted to an AC ground through a capacitor C5. The microstrip transmission line TL2 provides an inductive component at the collector terminal 38 of transistor Q1. The inductive component generated by the microstrip transmission line TL2 can be varied by varying the length of the microstrip element, since a larger line length induces a larger inductance component which in turn causes a larger absolute magnitude of negative resistance induced across the base terminal 40 of bipolar transistor Q1. The inductive component of transmission line TL2 in conjunction with the shunt capacitive element provided by the coarse Q-factor circuit 36 via PIN diode D1, which is seen by the emitter 42 of transistor Q1, is used to set the nominal negative resistance of the negative resistance circuit 20, and thus the nominal insertion loss of the active band-pass filter 10.

The emitter terminal 42 of bipolar transistor Q1 is coupled to both a fine Q-factor tuning circuit 34 and a coarse Q-factor tuning circuit 36. The fine Q-factor tuning circuit 34 includes a pair of heterojunction bipolar transistors (HBTs) Q2 and Q3, resistor R3 and input pad 25. Transistors Q2 and Q3 have respective base terminals 52 and 46 which are connected together. Transistor Q2 has a collector terminal 50 coupled directly to the emitter terminal 42 of transistor Q1. Transistors Q2 and Q3 each have respective emitter terminals 54 and 48 which are both coupled to ground. Transistor Q3 also has a collector terminal 44 which is coupled to both resistor R3 and the base terminal 46 of transistor Q3.

The fine tuning circuit 34 receives a fine tuning voltage $V_q$ via input 24. The fine tuning voltage $V_q$ is applied to contact pad 25 and thereafter applied to transistors Q2 and Q3. By appropriately changing the fine tuning voltage $V_q$, the collector current $I_q$ applied to the collector terminal 38 of transistor Q1 can be varied. Given a frequency operation of around six gigahertz (6 GHz), a total fine tuning range of negative resistance of approximately fifteen ohms (15 Ω) may be achieved via the fine tuning circuit 34 according to one example. It should be understood that fine tuning voltage $V_q$ may be manually adjusted or automatically adjusted by way of a control circuit as will be discussed hereinafter in connection with FIG. 4.

The coarse tuning circuit 36 is generally provided by an emitter shunt circuit which includes heterojunction bipolar transistors (HBTs) Q4 and Q5, a pair of PIN diodes D1 and D2, resistor R4, a contact pad 27, and a bypass capacitor C6. A coarse tuning voltage $V_{qq}$ is supplied to input 26 and received by contact pad 27. By selectively changing the coarse tuning voltage $V_{qq}$, a bias current $I_{qq}$ through PIN diode D1 can likewise be changed. This in turn varies the junction capacitance of PIN diode D1 and thus the negative resistance induced at the base terminal 40 of transistor Q1. The coarse tuning circuit 36 provides a larger amount of tuning of the negative resistance relative to the fine tuning provided by fine tuning circuit 34. For example, given a frequency operation of six gigahertz, a coarse tuning range of more than thirty-five ohms (35 Ω) of negative resistance could be realized, in contrast to the fine tuning range of 15 Ω for the fine tuning circuit 34 mentioned above.

The tuneable negative resistance circuit 20 can be applied to each pole or section of a multi-pole (multi-section) passive filter structure 12. Moreover, the negative resistance circuit 20 can provide a combination of coarse and fine tuning of the negative impedance. When implemented with a passive band-pass filter 12, the negative resistance circuit 20 of the present invention provides coarse and fine Q-factor tuning control of the active band-pass filter 10. This tunability feature allows an additional degree of freedom to correct for any undesirable losses otherwise exhibited by passive band-pass filters, especially filters constructed on semi-insulating substrate materials such as gallium arsenide (GaAs).

Figure 4:
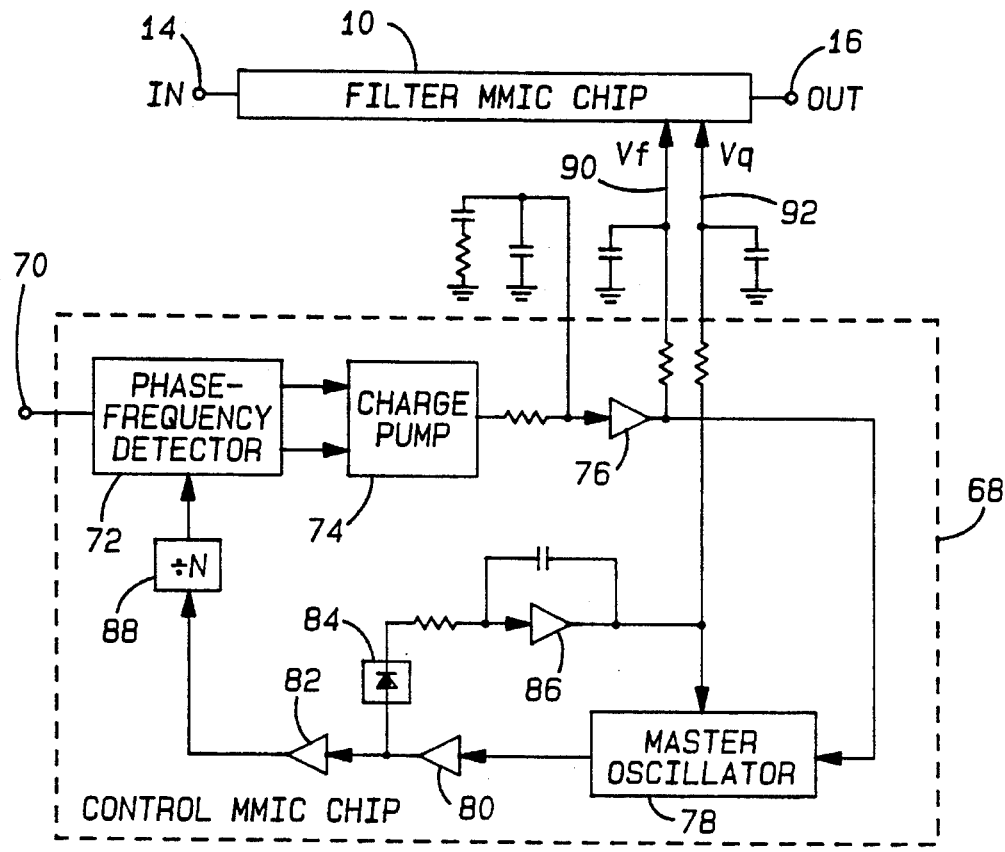
FIG. 4 is a block diagram of a control circuit for providing automatic control of frequency tuning and fine Q-factor tuning of the active band-pass filter circuit according to one example.

As previously mentioned, the fine tuning voltage $V_q$ can be supplied via an automatic control circuit. One example of a possible control circuit 68 is provided in FIG. 4. The control circuit 68 as shown in FIG. 4 is a known dual-loop master-slave filter control scheme which is described in detail in technical literature by Vladimir Aparin and Peter Katzin entitled "Electronically Tuned L-S Band Filters", published in Applied Microwave and Wireless, pages 42 through 49, Fall, 1994. The above-identified technical literature is herein incorporated by reference.

Generally speaking, the control circuit 68 includes a phase-frequency detector 72, charge pump 74, PLL buffer 76, master oscillator 78, amplifiers 80 and 82 and a digital divider 88 coupled in a loop configuration. The control circuit 68 also includes a diode 84 and operational amplifier 86 formed in a Q-control loop with master oscillator 78 and amplifier 80. The active components of the control circuit 68 are preferably formed on a monolithic millimeter wave integrated circuit (MMIC) chip and receive a subharmonic frequency reference input via input 70. The control circuit 68 generates controlled bias voltages for the active band-pass filter 10 and automatically adjusts the bias voltages to maintain a zero dB pass-band insertion loss and a stable center frequency $f_0$ of the filter 10. Included are two outputs, a frequency control voltage output $V_f$ on line 90 and a Q-factor control voltage output $V_q$ on line 92. Accordingly, the control circuit 68 provides both frequency control and automatic fine Q-factor tuning control. However, it should be appreciated that this control scheme provided in FIG. 4 is merely an example, and other control schemes could be employed to provide automatic control of the fine Q-factor tuning so as to continuously compensate for subsequent changes in resistive losses exhibited in the passive band-pass filter structure 12.

Figure 5:
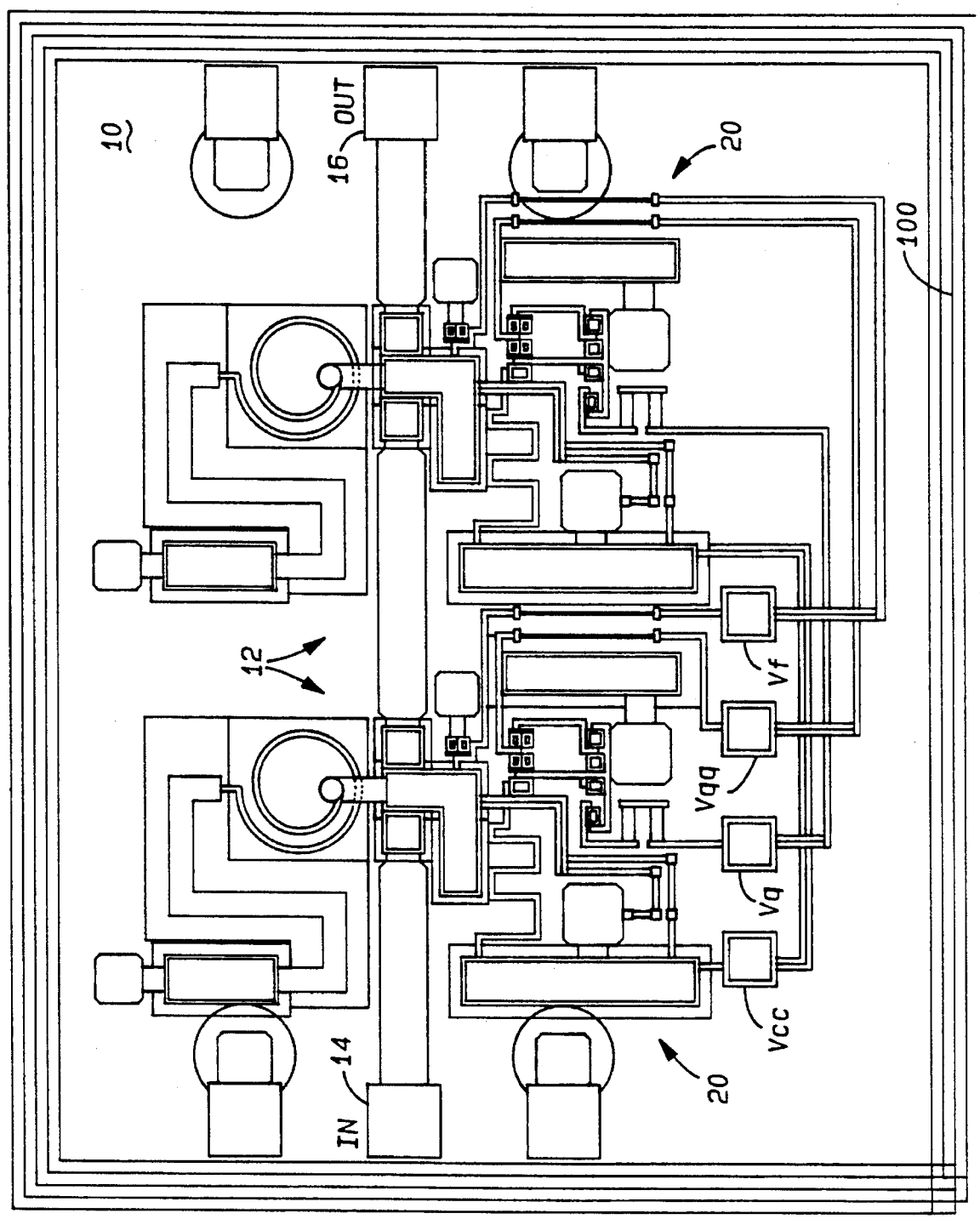
FIG. 5 is a top view of an integrated circuit filter chip containing the two-pole active band-pass filter monolithically integrated on a semi-insulating substrate.
Figure 7:
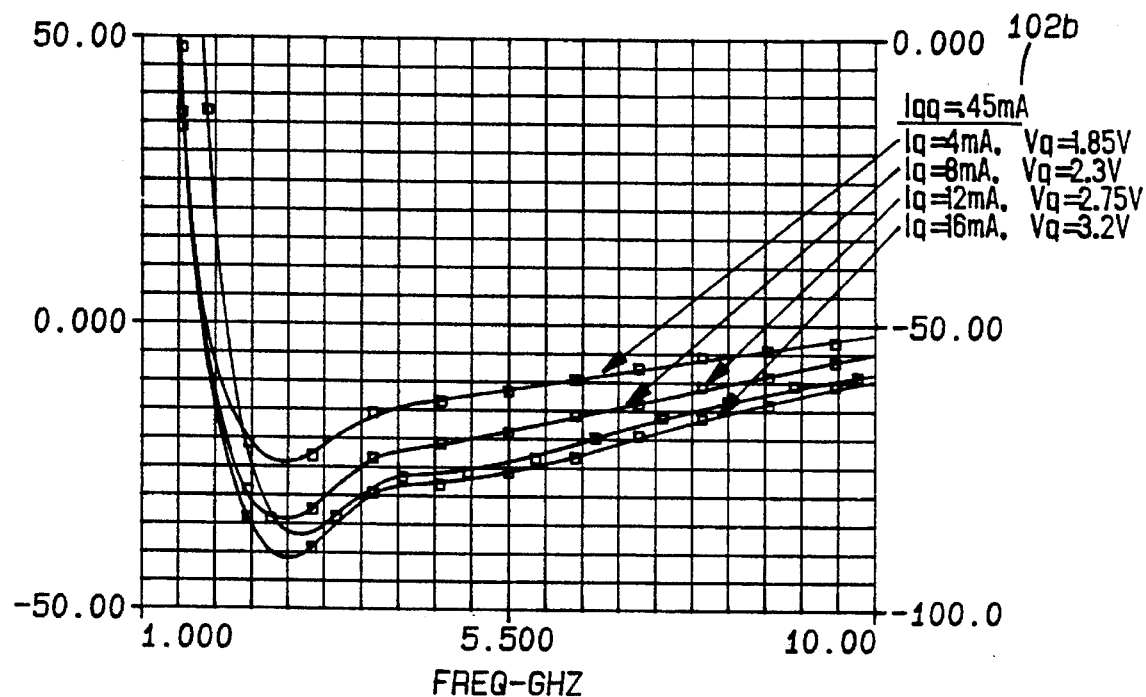
FIG. 7 is a graphical representation of negative resistance produced with fine tuning Q-factor adjustments.

Referring now to FIG. 5, an example of the enhanced Q-factor active tuneable two-pole band-pass filter 10 of FIG. 1 is shown monolithically integrated on a GaAs semi-insulating chip 100. The active band-pass filter 10 is illustrated in a monolithic microwave integrated circuit (MMIC) chip layout and may be fabricated on a chip having physical dimensions of about 1.2 millimeters by 1.5 millimeters.

The operation of the active tuneable band-pass filter 10 will now be described with reference to FIGS. 6 through 12 in accordance with an example of the two-pole filter configuration of the present invention. In operation, an input signal IN is applied to input terminal 14 and introduced to inductive and capacitive components provided via active band-pass filter 10. The input signal IN is filtered via band-pass filter 10 and signals within the frequency passband are output via output terminal 16 as shown by output signal OUT. In doing so, the active band-pass filter 10 has a frequency pass band centered about tuned center frequency $f_0$. The tuned frequency $f_o$ is determined by the varactor frequency tuning circuit 18 in response to tuneable frequency tuning voltage $v_f$.

In order to compensate for resistive losses generally present with passive band-pass filters, such as structure 12, the tuneable negative resistance circuit 20 of the present invention provides a tuneable amount of negative resistance to the passive band-pass filter structure 12 to compensate for such resistive losses. This is accomplished by providing the proper shunt inductance and shunt capacitance to the three-terminal device 30, and more specifically to the heterojunction bipolar transistor Q1.

As previously mentioned, the negative resistance circuit 20 has a coarse tuning circuit 36 connected to the emitter terminal 42 of transistor Q1. The coarse Q-factor tuning circuit 36 allows for a relatively coarse adjustment of negative resistance by changing coarse tuning voltage $V_{qq}$. This may generally be accomplished by manually selecting coarse tuning voltage $V_{qq}$ generally after the manufacture of the active band-pass filter 10 is complete. This will compensate for at least some of the resistive losses that may be present and will bring the Q-factor of the active band-pass filter 10 closer to the desired amount.

With the coarse Q-factor tuning voltage $V_{qq}$ selected, the active band-pass filter 10 may further be adjusted via the fine tuning circuit 34. Fine tuning circuit 34 allows for precise adjustment of the negative resistance either before use for a certain application or during use for a given application by manually or automatically adjusting voltage $V_q$ to compensate for temperature effects or other possible effects which may change the overall Q-factor of the filter 10. This is generally accomplished by varying the fine tuning voltage $V_q$ applied to the fine Q-factor tuning circuit 34. Accordingly, precise Q-factor control and resistive loss compensation can be achieved. In addition, oscillations and adjustments could be eliminated by the availability of both the coarse and a fine tuning negative resistance circuit configuration.

Figure 6:
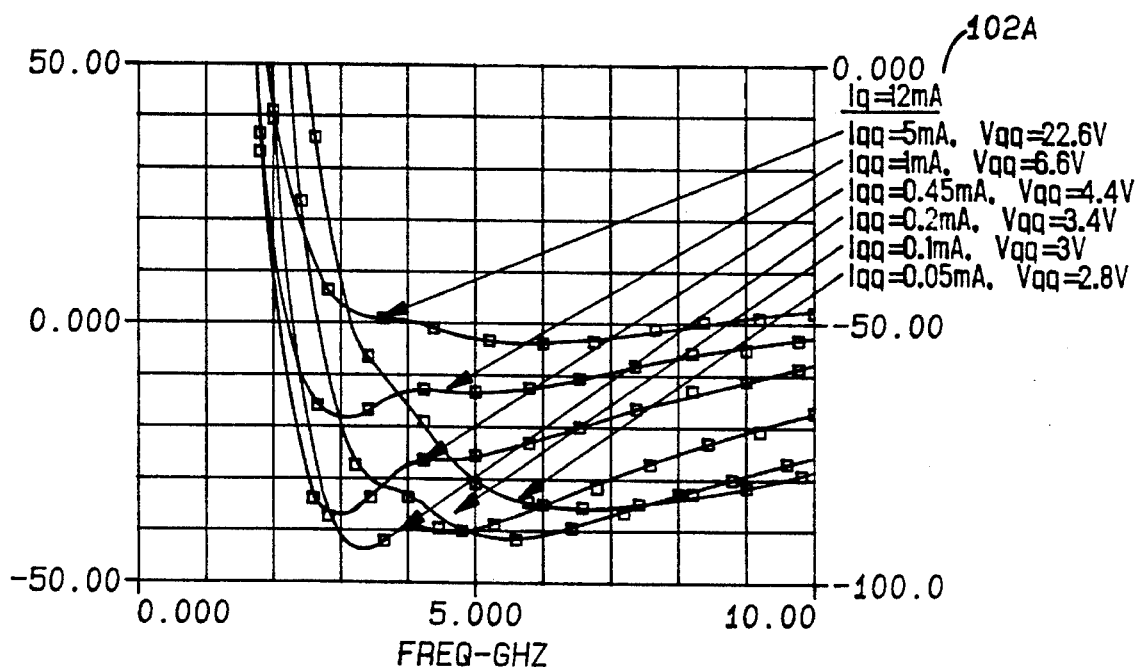
FIG. 6 is a graphical representation of negative resistance produced with coarse Q-factor tuning adjustments.

The coarse Q-factor tuning circuit 36 can be tuned as shown in FIG. 6 which illustrates negative resistance 102A achieved with various selected coarse tuning voltages $V_{qq}$, while the fine tuning voltage $V_q$ is maintained at a constant.

A fairly large amount of negative resistance may be produced by the negative resistance circuit 20 by varying coarse tuning circuit 36. For example, a negative resistance of over 35 Ω could be achieved with the coarse tuning circuit 36 alone. In contrast, the fine tuning circuit 34 achieves a more limited negative resistance tuning range as illustrated by the negative resistance 102B provided in FIG. 7. For example, a total tuning range of about 15 Ω may be achieved by varying the fine tuning voltage $V_q$, while maintaining coarse tuning voltage $V_{qq}$ at a constant. Together, the coarse and fine negative resistance tuning allow for an additional degree of freedom to correct for any undesirable losses inherent in passive band-pass filters, especially those filters generally fabricated on a semi-insulting substrate.

Figure 8:
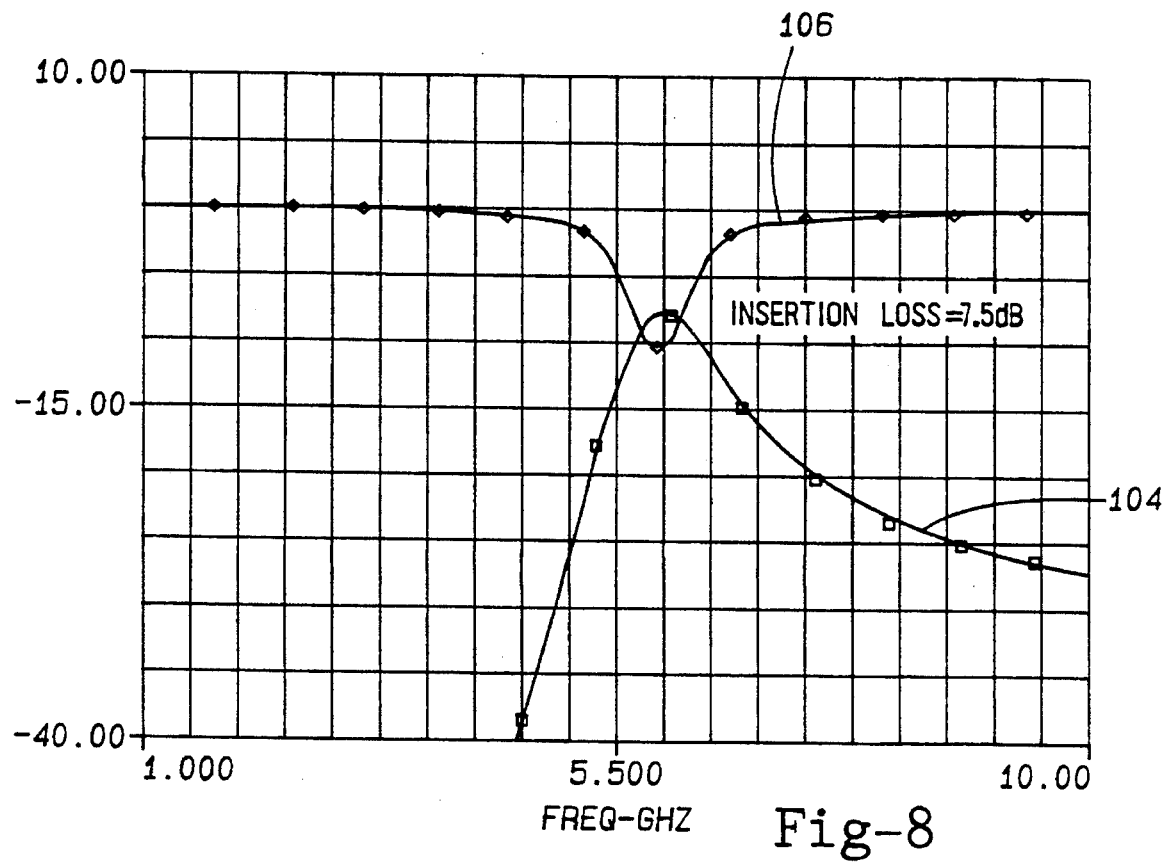
FIG. 8 is a graphical representation of simulated performance showing insertion losses exhibited with an uncompensated passive band-pass filter.
Figure 9:
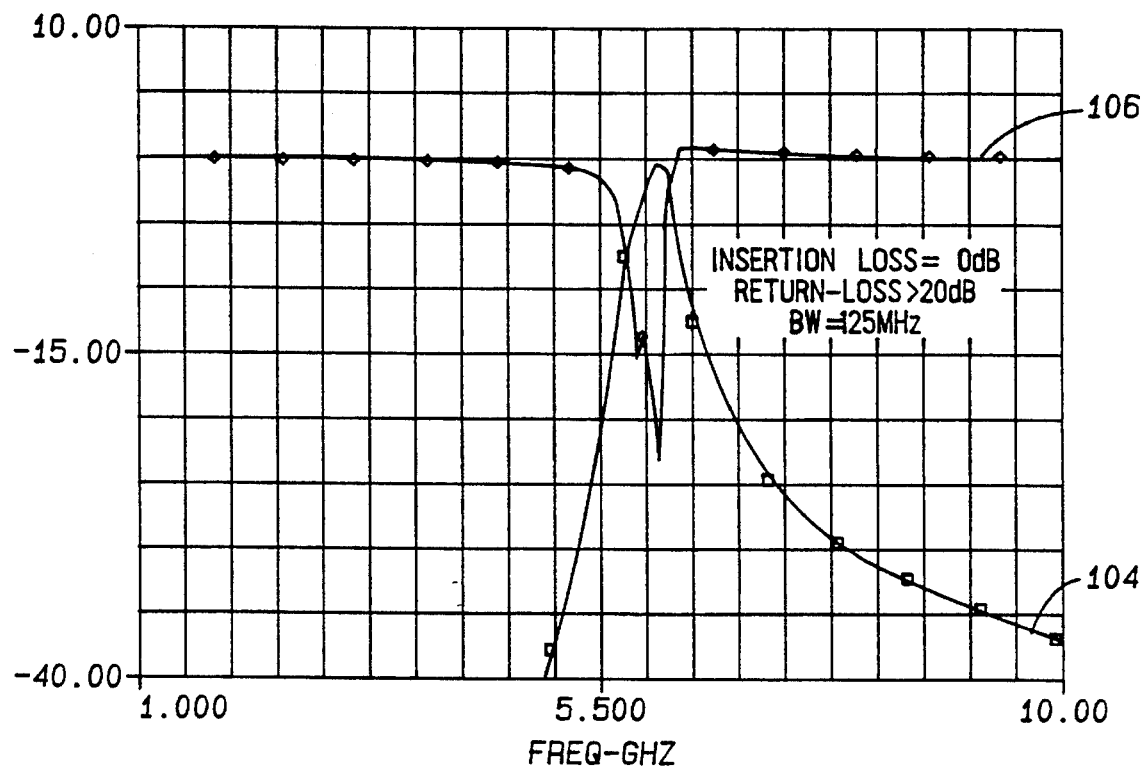
FIG. 9 is a graphical representation of simulated performance of the tuneable active band-pass filter of the present invention which provides compensation for resistive losses.

Referring to FIG. 8, the performance of a typical two-pole passive band-pass filter structure on GaAs substrate is shown without the application of the negative resistance circuit 20. From the graph, an insertion loss 104 of 7.5 dB is present. This loss is also exhibited by the input and output return loss 106. By incorporating the negative resistance circuit 20 of the present invention, an enhanced Q-factor filter response with an insertion loss 104 of zero dB can be achieved as is provided in FIG. 9. The resulting active band-pass filter 10 has a 0 dB insertion-loss 104, a 20 dB return-loss 106 with a 125 megahertz 3-dB bandwidth. The 50 dB rejection ratio ($f_o/f_{50}$ dB) is 1.35:1. The selectivity of the active band-pass filter 10 has been improved dramatically when compared to the passive filter design alone.

Figure 10:
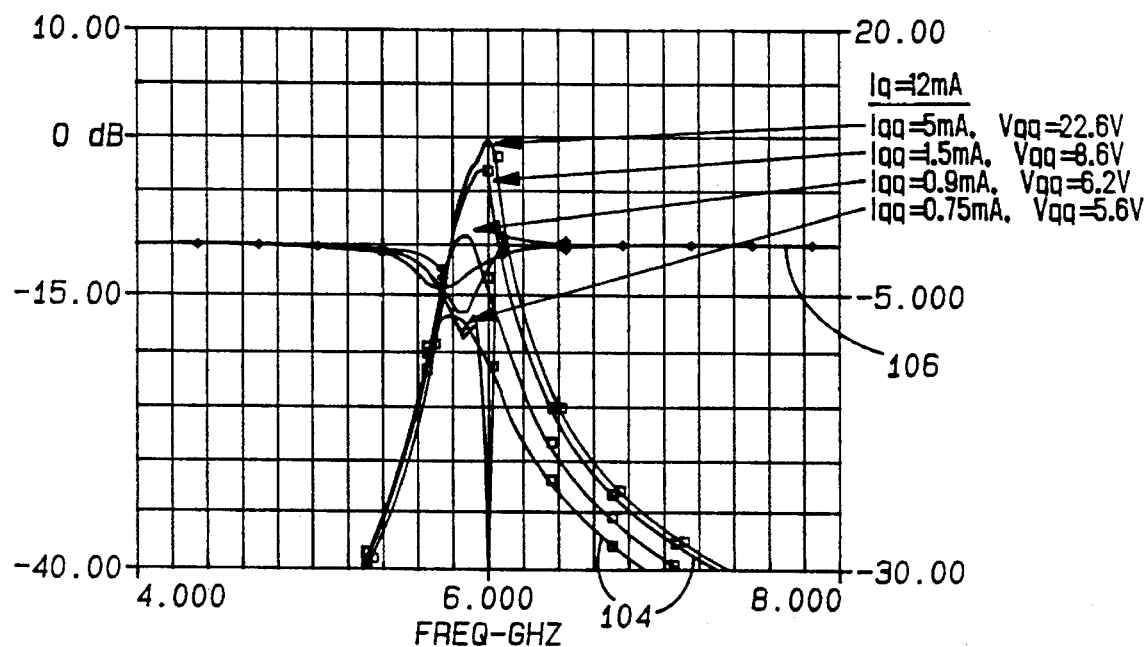
FIG. 10 is a graphical representation of the simulated performance achieved with the active band-pass filter of the present invention during coarse Q-factor tuning.
Figure 11:
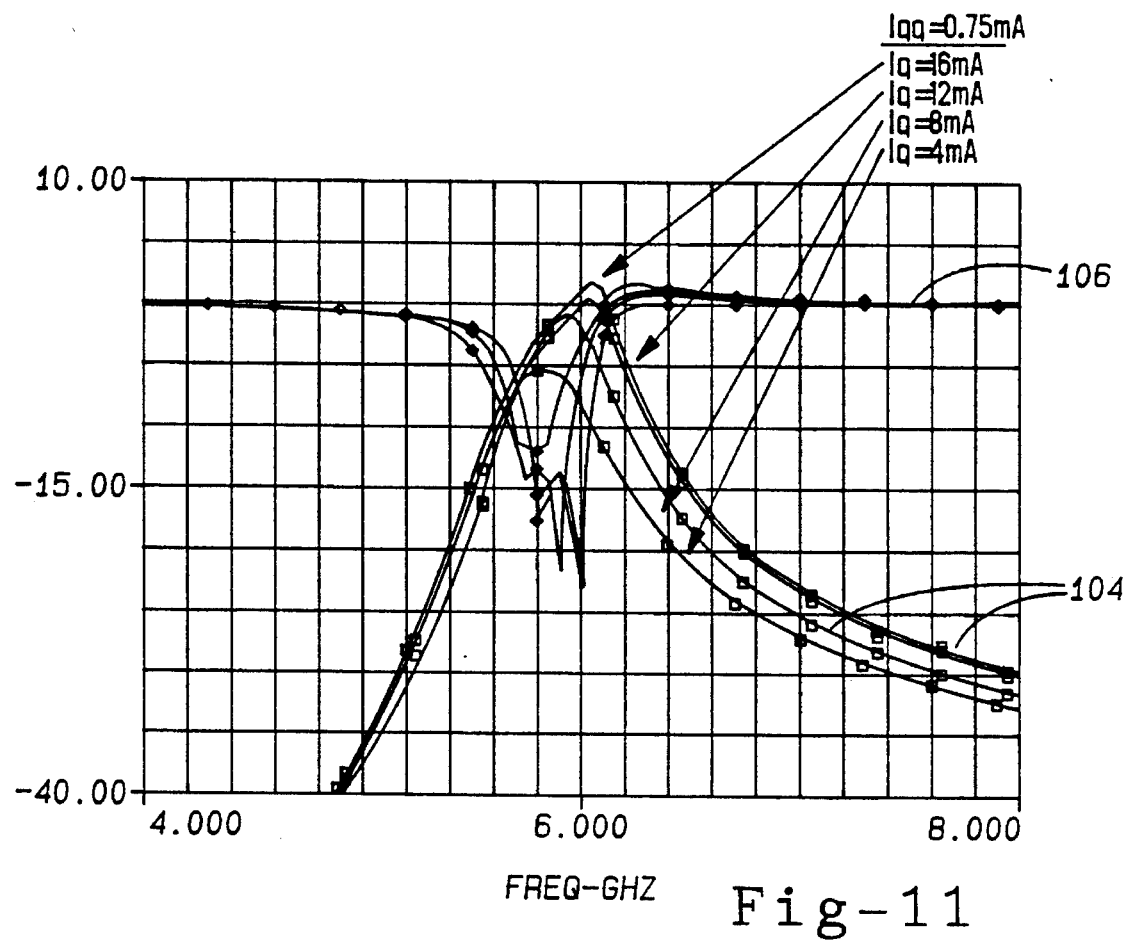
FIG. 11 is a graphical representation of the simulated performance achieved with the active band-pass filter of the present invention during fine Q-factor tuning.

The effects of coarse Q-factor tuning on the two-pole filter structure 10 for a fixed fine tuning current $I_q$ equal to about 12 milliamps is illustrated in FIG. 10. For the various coarse Q-factor tuning voltages $V_{qq}$ and corresponding coarse tuning current $I_{qq}$ biases of PIN diode D1, the coarse tuning can compensate for greater than 15 dB insertion loss 104 of the passive filter structure 12. Referring to FIG. 11, the effects of fine Q-factor tuning on the two-pole filter 10 are shown for a fixed coarse tuning current $I_{qq}$ equal to 0.75 milliamps. For various tuning voltages of fine tuning voltage $V_q$ and corresponding fine tuning collector current $I_q$ biases of transistor Q1, the fine tuning can compensate for approximately six (6) dB of insertion loss 104 of passive filter structure 12.

Figure 12:
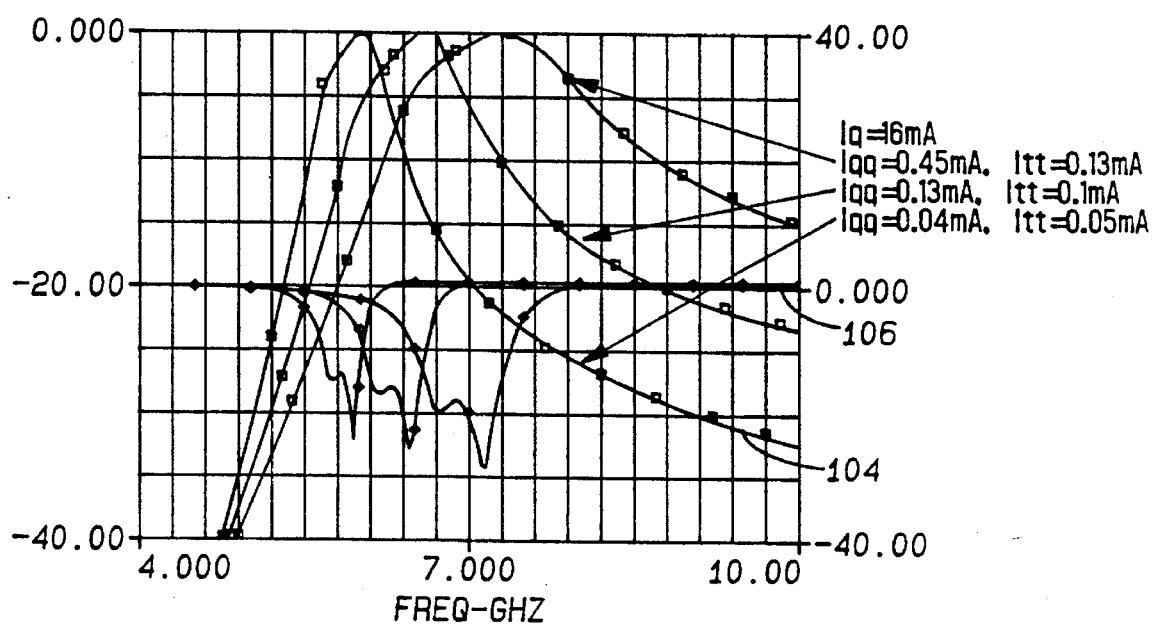
FIG. 12 is a graphical representation of the simulated performance of the active band-pass filter of the present invention during a combination of frequency and Q-factor tuning.

Finally, FIG. 12 illustrates tuning capability of the active band-pass filter 10 by varying the PIN diode D3 varactor bias current by varying frequency tuning voltage $V_f$ and re-adjusting the coarse Q-factor control current $I_{qq}$ by changing coarse tuning voltage $V_{qq}$. This provides a tuning range of about 1.3 GHz or about twenty percent tuning range. Accordingly, the coarse and fine tuning of the present invention may be performed subsequent to changing the frequency tuning voltage $V_f$ to compensate for any changes in resistive loss associated therewith.

The coarse and fine Q-factor tuning features of the present invention provide a unique solution for realizing the active band-pass filter circuit 10 in a high volume production environment. Since the active band-pass filter circuit 10 can produce negative resistance which is sensitive to process variations and is a necessary start-up condition for oscillation, the negative resistance circuit is prone to oscillate. By having a coarse Q-factor tuning control, pre-production tuning of the Q-factor into a stable operation can be achieved. This corresponds to particular coarse tuning voltage control $V_{qq}$ which can be ascertained for a sample of the production parts, and fixed using an external voltage divider or reference for subsequent parts produced from the same wafer lot run. In this manner, each wafer lot run can be sampled, the coarse tuning voltage $V_{qq}$ ascertained, and the circuits adjusted in assembly, instead of coordinating a re-design and purchasing additional masks for production changes. Moreover, since there is no guarantee that the process will be stable enough to incorporate a fixed negative resistance design, the coarse and fine tuning adjustability advantageously allows for compensating for subsequent changes in resistive loss due to temperature variations, aging or other causes.

Thus, while this invention has been disclosed herein in connection with a particular example thereof, no limitation is intended thereby except as defined in the following claims. This is because a skilled practitioner recognizes that other modifications can be made without departing from the spirit of this invention after studying the specification and drawings.

What is claimed is:

1. An active band-pass filter with tuneable negative resistance, said filter comprising:

a passive filter circuit having an input and an output; and a negative resistance circuit coupled to the band-pass filter for generating a negative resistance so as to compensate for undesired resistive losses exhibited by the passive filter circuit, said negative resistance circuit including;

a transistor having a base, a collector and an emitter, said base being connected to the passive filter circuit for applying the negative resistance to the passive filter circuit;

an inductive shunt coupled to the collector of the transistor; and tuning means coupled to the emitter of the transistor for adjusting the amount of negative resistance generated at the base of the transistor.

2. The active band-pass filter as defined in claim 1 wherein said tuning means comprises:

a coarse tuning circuit; and a fine tuning circuit.

3. The active band-pass filter as defined in claim 2 wherein said coarse tuning circuit comprises at least one PIN diode coupled to the emitter of the transistor and a selectable coarse tuning voltage input.

4. The active band-pass filter as defined in claim 3 wherein said fine tuning circuit includes a selectable fine tuning voltage input.

5. The active band-pass filter as defined in claim 4 wherein said selectable fine tuning voltage input is automatically adjusted in response to a control circuit so as to maintain a desired negative resistance.

6. The active band-pass filter as defined in claim 1 further comprising a varactor frequency tuning circuit coupled to the passive filter circuit.

7. The filter as defined in claim 1 wherein said passive filter circuit is fabricated on a semi-insulating substrate and components of said circuit exhibit resistive losses which are substantially compensated for by said negative resistance.

8. An active band-pass filter which compensates for resistive losses that may exist with passive circuit components, said filter comprising:

a passive filter circuit having an input and an output; and a negative resistance circuit coupled to the band-pass filter for generating a negative resistance so as to compensate for undesired resistive losses, said negative resistance circuit including;

a three terminal device having a first terminal connected to the passive filter circuit for providing the negative resistance to the filter circuit;

a coarse tuning circuit having a diode and a voltage input that is selectable for coarse tuning the negative resistance applied to the passive filter circuit; and a fine tuning circuit having a voltage input that is selectable for fine tuning the negative resistance applied to the passive filter circuit.

9. The active band-pass filter as defined in claim 8 wherein said three terminal device comprises a bipolar transistor having a base, collector and emitter, said base being connected to the passive filter circuit and the emitter connected to the coarse and fine tuning circuits.

10. The active band-pass filter as defined in claim 9 wherein said emitter of the transistor is coupled to a capacitive shunt.

11. The active band pass filter as defined in claim 9 wherein said collector of the transistor is coupled to an inductive shunt.

12. The active band-pass filter as defined in claim 8 further comprising a varactor frequency tuning circuit coupled to the passive filter circuit for providing frequency tuning.

13. A tuneable negative resistance circuit for producing a negative resistance, said negative resistance circuit comprising:

a bipolar transistor having a base, a collector and an emitter;

an inductive shunt coupled to the collector of the bipolar transistor;

an output coupled to the base of the bipolar transistor for outputting a tuneable amount of negative resistance;

a coarse tuning circuit coupled to the emitter of the bipolar transistor, said coarse tuning circuit having a diode and a selectable voltage input for providing coarse tuning of the negative resistance; and a fine tuning circuit coupled to the emitter of the bipolar transistor, said fine tuning circuit having a selectable voltage input for providing fine tuning of the negative resistance.

14. The negative resistance circuit as defined in claim 13 wherein said selectable voltage input of the fine tuning circuit receives an automatically controlled voltage for providing automatic fine tuning of the negative resistance.

15. A method of generating a tuneable negative resistance for a band-pass filter to compensate for resistive losses, said method comprising the steps of:

providing a passive filter circuit having an input and an output;

providing a negative resistance circuit having a transistor with a base, a collector and an emitter;

generating a negative resistance at the base of the transistor;

adjusting current flow through a diode which is coupled to the emitter of the transistor so as to provide coarse adjustment of the negative resistance; and adjusting current flow into the collector of the transistor to provide for fine tuning of the negative resistance.

16. The method as defined in claim 15 further comprising the step of tuning the center frequency of the band-pass filter.

17. The method as defined in claim 15 wherein said step of adjusting current flow into the collector is in response to an automatically controlled voltage.

* * * * *